(12) United States Patent
Lin et al.

(10) Patent No.: US 6,301,698 B1
(45) Date of Patent: Oct. 9, 2001

(54) METHOD FOR CREATING THE SUB-RESOLUTION PHASE SHIFTING PATTERN FOR OUTRIGGER TYPE PHASE SHIFTING MASKS

(75) Inventors: Chia-Hui Lin, Hsin-Chu; San-De Tzu, Taipei, both of (TW)

(73) Assignee: Taiwan Semiconductor Manufacturing Company, Hsin-Chu (TW)

(*) Notice: Subject to any disclaimer, the term of this patent is extended or adjusted under 35 U.S.C. 154(b) by 0 days.

(21) Appl. No.: 09/387,434

(22) Filed: Sep. 1, 1999

(51) Int. Cl.[7] .................................................. G06F 17/50
(52) U.S. Cl. .................. 716/19; 430/5; 378/35; 382/144
(58) Field of Search ........................ 716/19–21; 430/4–5; 378/34–35; 382/144

(56) References Cited

U.S. PATENT DOCUMENTS

| | | | |
|---|---|---|---|
| 5,308,741 | 5/1994 | Kemp | 430/312 |
| 5,537,648 | 7/1996 | Liebmann et al. | 716/19 |
| 5,538,833 | 7/1996 | Ferguson et al. | 430/325 |
| 5,658,695 * | 8/1997 | Choi | 430/5 |
| 5,682,323 * | 10/1997 | Pasch et al. | 716/19 |
| 5,702,848 | 12/1997 | Spence | 430/5 |
| 5,795,685 * | 8/1998 | Liebmann et al. | 430/5 |
| 5,807,649 * | 9/1998 | Liebmann et al. | 430/5 |
| 5,920,487 * | 7/1999 | Reich et al. | 716/21 |
| 5,978,501 * | 11/1999 | Badger et al. | 382/144 |
| 5,991,006 * | 11/1999 | Tsudaka | 355/53 |
| 6,110,647 * | 8/2000 | Inoue et al. | 430/312 |
| 6,212,671 * | 4/2001 | Kanehira et al. | 716/19 |
| 6,221,539 * | 4/2001 | Kotani et al. | 430/5 |

OTHER PUBLICATIONS

Kahn, "IC layout and manufacturability: critical links and design flow implications", Proceedings of Twelfth International Conference on VLSI Design, Jan. 7, 1999. pp. 100–105.*

Liu et al., "Computer-aided phase shift mask design with reduced complexity", IEEE Transactions on Semiconductor Manufacturing, vol. 9, No. 2, May 1996, pp. 170–181.*

Pugh et al., "Impact of high resolution lithography on IC mask design", Proceedings of the IEEE 1998 Custom Integrated Circuits Conference, May 11, 1998, pp. 149–153.*

* cited by examiner

*Primary Examiner*—Matthew Smith
*Assistant Examiner*—Phallaka Kik
(74) *Attorney, Agent, or Firm*—George O. Saile; Stephen B. Ackerman; Larry J. Prescott (57) ABSTRACT

A method is described for using computer aided design data for contact holes in a background, such as an opaque background or a phase shifting background, to generate computer aided design data for fabricating a mask an outrigger pattern. The outrigger pattern mask has contact holes surrounded by a first border of opaque material and the first border of opaque material surrounded by a third border of attenuating or 100% transmittance phase shifting material. The third border of attenuating or 100% transmittance phase shifting material is surrounded by opaque material. The design data for the contact hole pattern, a background pattern, a first correction pattern, and a second correction pattern are combined in a computer processor to generate final data. The final data is used to fabricate the mask.

20 Claims, 8 Drawing Sheets

METHOD FOR CREATING THE SUB-RESOLUTION PHASE SHIFTING PATTERN FOR OUTRIGGER TYPE PHASE SHIFTING MASKS

BACKGROUND OF THE INVENTION (1) Field of the Invention

This invention relates to the logical generation of mask patterns for outrigger type attenuating or 100% transmittance phase shifting masks.

(2) Description of the Related Art

Figure 1:
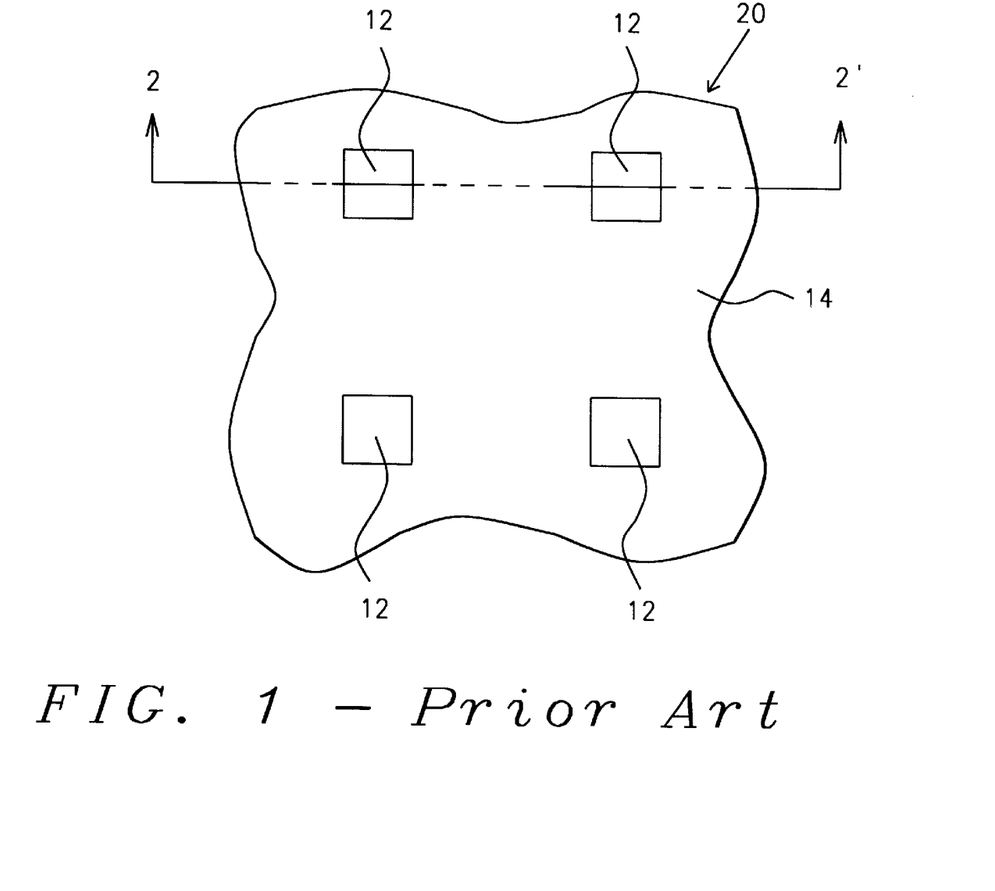
FIG. 1 shows a top view of a phase shifting mask used to form contact holes in an integrated circuit wafer.
Figure 2:
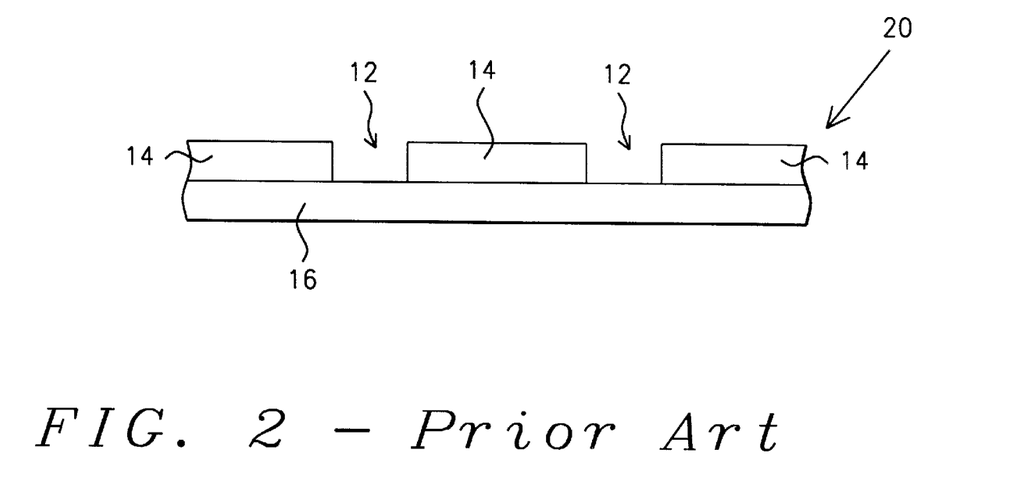
FIG. 2 shows a cross section view of the phase shifting mask of FIG. 1 taken along line 2–2' of FIG. 1.

As critical dimensions become smaller phase shifting masks are more frequently used for forming contact holes in integrated circuit wafers. FIGS. 1 and 2 show a phase shifting mask used for forming contact or via holes. FIG. 1 shows a top view of the mask 20 showing contact holes 12 formed in the phase shifting material. The phase shifting material can be attenuating phase shifting material or material having 100% transmittance. FIG. 2 shows a cross section view of the mask taken along line 2–2' of FIG. 1. FIG. 2 shows a layer of attenuating or 100% transmittance phase shifting material 14 formed on a transparent mask substrate 16. Holes 12 corresponding contact holes are formed in the attenuating phase shifting material. Masks of this type work well but can have a problem due to side lobe effect.

Figure 3:
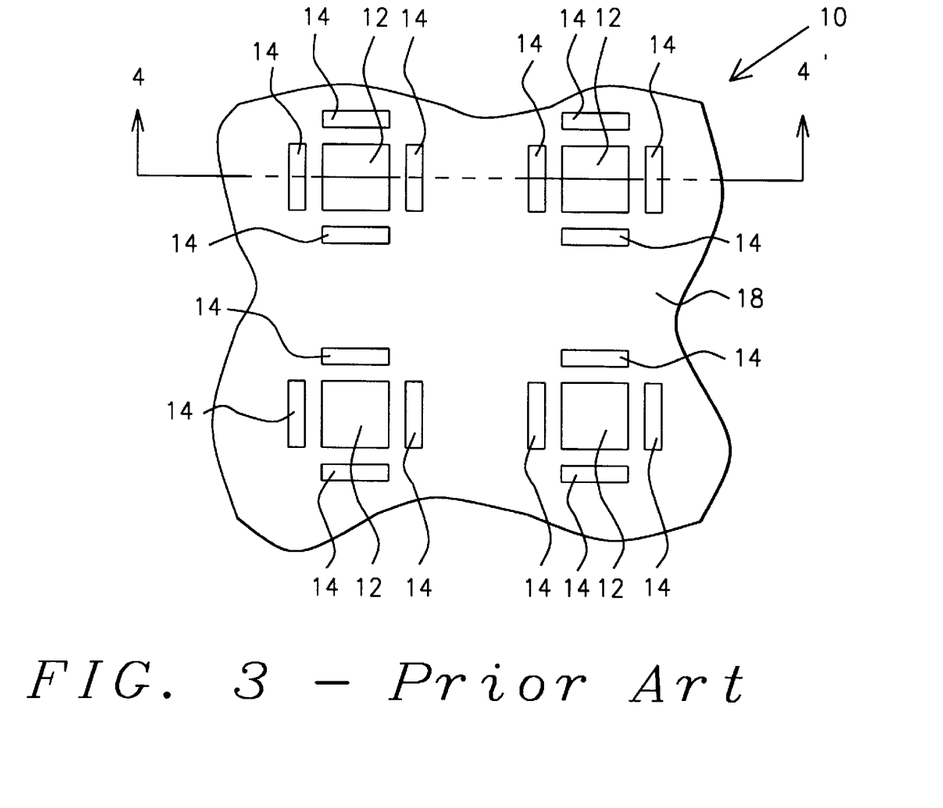
FIG. 3 shows a top view of a conventional outrigger type phase shifting mask used to form contact holes in an integrated circuit wafer.
Figure 4:
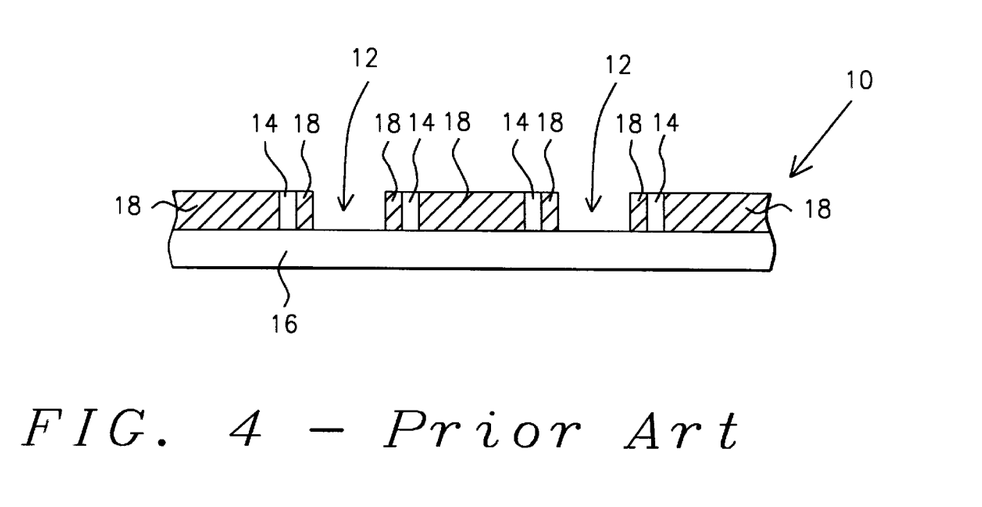
FIG. 4 shows a cross section view of the phase shifting mask of FIG. 3 taken along line 4–4' of FIG. 3.

FIGS. 3 and 4 show an outrigger type phase shifting mask 10 used for forming contact or via holes which can avoid the problem of side lobe effect. The 10 mask shown in FIGS. 3 and 4 uses contact hole openings 12 in an opaque background 18 with outrigger bars 14 formed of phase shifting material on all four sides of the contact hole opening. FIG. 3 shows the top view of the mask 10. FIG. 4 shows a cross section of the mask 10 along line 4–4' of FIG. 3 and shows the opaque background 18 and the phase shifting outrigger bars 14 formed on a transparent mask substrate 16. The phase shifting material can be attenuating phase shifting material or can have 100% transmittance. The mask of FIGS. 3 and 4 provides good image quality for the contact hole formation and also avoids the problem of side lobe effect.

U.S. Pat. No. 5,538,833 to Ferguson et al. describes the use of a process of phase edge lithography in the fabrication of integrated circuit chips in which chrome images are biased on a phase edge of a phase shift mask and the mask is overexposed to compensate for bias.

U.S. Pat. No. 5,702,848 to Spence describes masks used in integrated circuits where pattern intersection regions are divided into categories of stacks and different phase assignment rules are employed for the different stacks.

U.S. Pat. No. 5,537,648 to Liebman et al. describes a method implemented in a computer aided design system to automatically generate phase shifted masks. The method uses a series of basic geometric operations to design areas to design areas requiring phase assignment, resolve conflicting phase assignments, and eliminate unwanted phase edges.

U.S. Pat. No. 5,807,649 to Liebman et al. describes a lithographic patterning method using a phase shift trim mask.

U.S. Pat. No. 5,308,741 to Kemp describes a lithographic method using double exposures, physical mask shifting, and light phase shifting to form masking features on a substrate masking layer.

SUMMARY OF THE INVENTION

Outrigger type phase shifting masks, using attenuating or 100% transmittance phase shifting materials, are useful for achieving good image resolution while avoiding side lobe effect problems. This avoidance of the side lobe effect is even more important with phase shifting material having increased transmittance. As the usefulness of these phase shifting masks increases it becomes important to generate the mask patterns efficiently.

It is the principle objective of this invention to provide a method of generating outrigger type phase shifting masks using logic operations during the computer processing of the design data used for mask generation.

Figure 5:
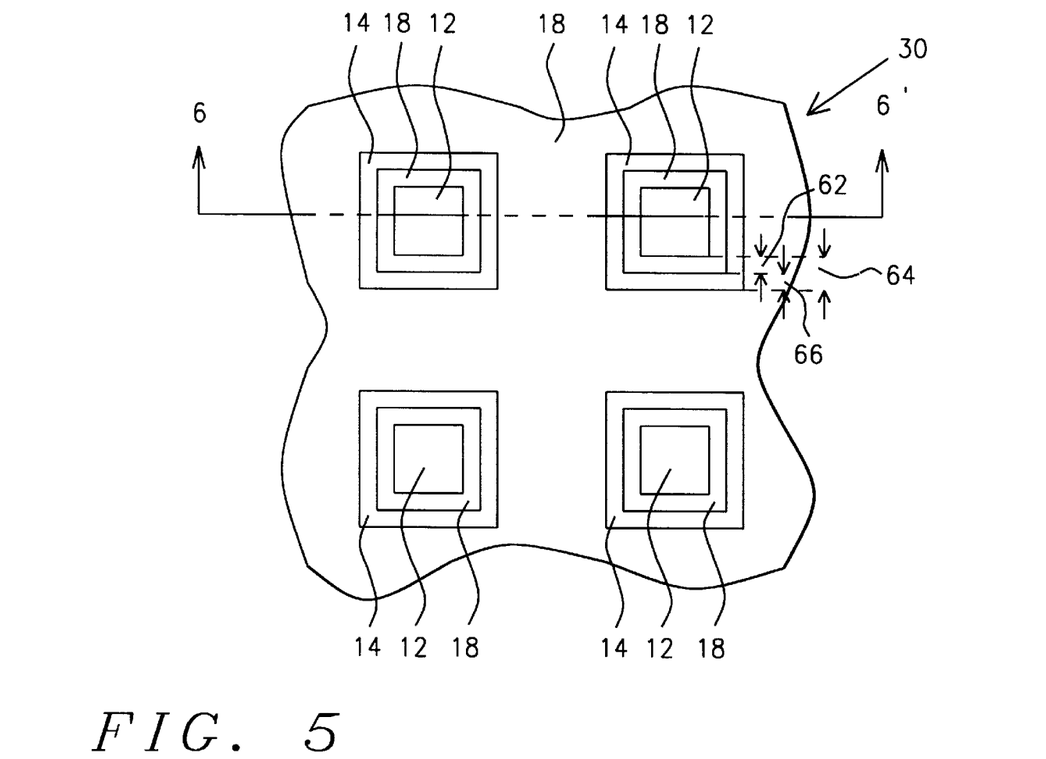
FIG. 5 shows a top view of an outrigger type phase shifting mask having the outrigger pattern of this invention used to form contact holes in an integrated circuit wafer.
Figure 6:
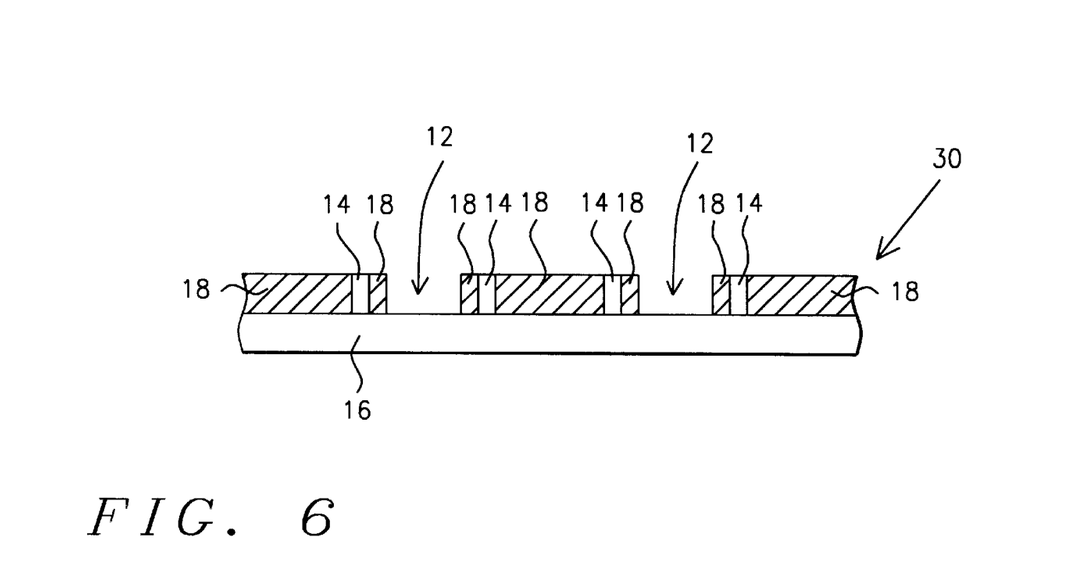
FIG. 6 shows a cross section view of the phase shifting mask of FIG. 5 taken along line 6–6' of FIG. 1.

This objective is achieved by changing the outrigger type mask 10 shown in FIGS. 3 and 4 to the Outrigger type mask 30 shown in FIGS. 5 and 6. FIG. 5 shows a top view of the mask 30 and FIG. 6 shows a cross section of the mask 30 taken along line 6–6' of FIG. 5. The outrigger type mask of this invention has contact holes 12 formed in a background of opaque material 18. An outrigger border 14 of attenuating or 100% transmittance phase shifting material is formed around the contact holes 12. As shown in FIG. 6 the mask is formed on a transparent mask substrate 16.

A first data set, P, representing the pattern of contact holes in a computer aided design system and a second data set, B, representing the opaque background of the mask are provided for the generation of the mask. The first data set, P, is logically added to the second data set, B, forming a third data set, P+B, representing contact holes in an opaque background. In order to form the outrigger type mask a fourth set, C1, representing a first correction and a fifth data set, C2, representing a second correction are provided. The fourth data set, C1, and the fifth data set, C2, are each logically subtracted from the third data set, P+B, forming a sixth data set, (P+B)–C1, and a seventh data set, (P+B)–C2. The seventh data set, (P+B)–C2, is then logically subtracted from the sixth data set, (P+B)–C1, forming a final data set which a represents the final mask pattern. The logical addition and logical subtraction operations are performed in a computer using software used to perform the computer aided mask generation.

The final data set is used to form the mask shown in FIGS. 5 and 6 and the operations leading to the final data set will later be described in greater detail. In this invention data sets representing a first correction and a second correction are combined with data sets representing the contact hole pattern and an opaque background pattern are combined to achieve a data set which can be used to generate the outrigger mask shown in FIGS. 5 and 6.

DESCRIPTION OF THE PREFERRED EMBODIMENTS

A more detailed description of the method of this invention for forming the phase shifting outrigger mask pattern will now be given with reference to FIGS. 5–14. FIGS. 5 and 6 show the phase shifting mask 30 having an outrigger pattern of this invention. The phase shifting material can be attenuating phase shifting material or have 100% transmittance. FIG. 5 shows a top view of the mask 30 and FIG. 6 shows a cross section view of the mask 30 taken along line 6–6' of FIG. 5. FIGS. 5 and 6 show the contact holes 12 surrounded by a border of opaque material 18 having a second width 62. The border of opaque material 18 is surrounded by a border of attenuating or 100% transmittance phase shifting material 14 having a third width 66. The second width 62 and the third width 66 are equal to a first width 46. As shown in FIG. 6 the mask 30 is formed on a transparent mask substrate 16.

Figure 7A:
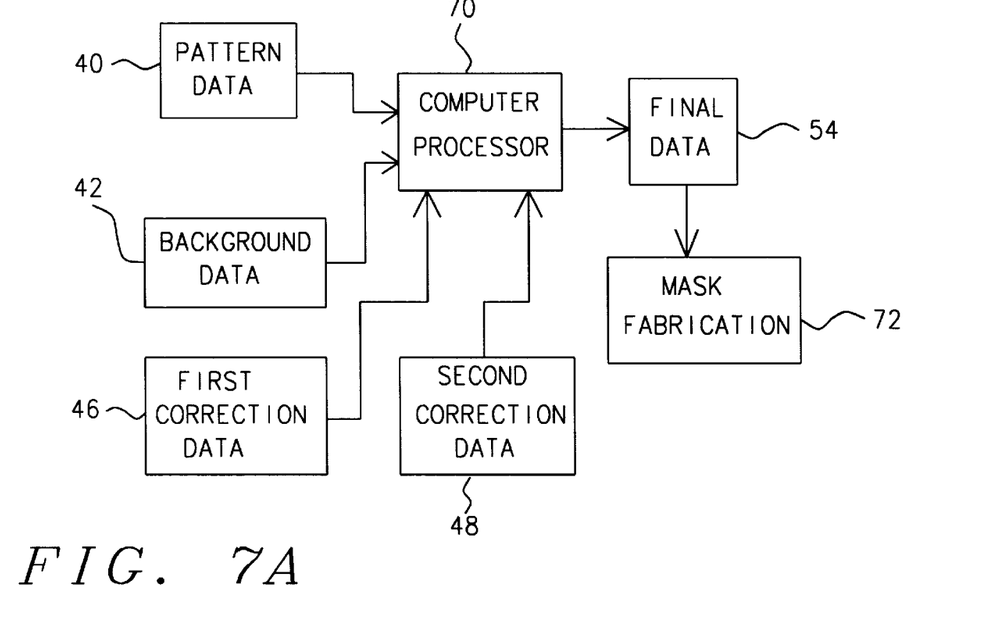
FIG. 7A shows a flow diagram of the data into the computer processor, the final data from the computer processor and into a mask fabrication unit.
Figure 7B:
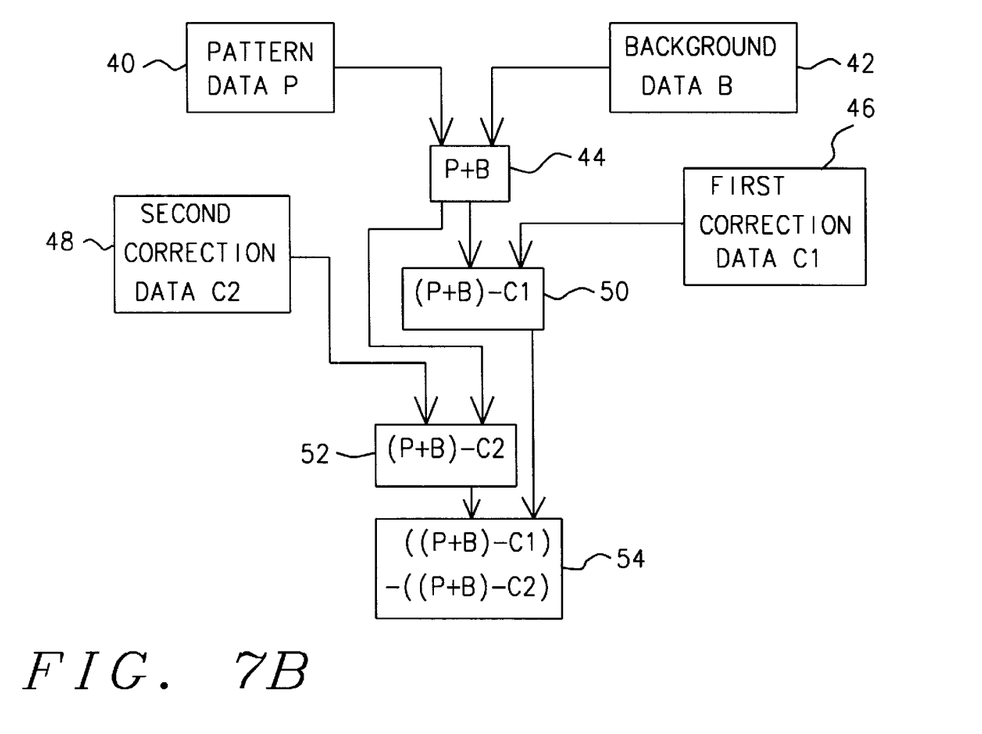
FIG. 7B shows the flow diagram showing the logical operations in the computer used to generate the final data set.

The method of this invention uses the design data, used for computer aided design, for the contact hole pattern and the background around the contact holes. Logical operations are performed on this data in a computer processor to produce the final design data used to fabricate the mask. FIGS. 7A and 7B show flow diagrams of these logical operations. As shown in FIG. 7A a first data set 40, representing the contact hole pattern, and a second data set 42, representing an opaque background, are fed into a computer 70. The computer processor performs logical operations on the data and produces a final data set 54. The final data set 54 is fed to a mask fabrication unit 72 for producing the mask.

Figure 8A:
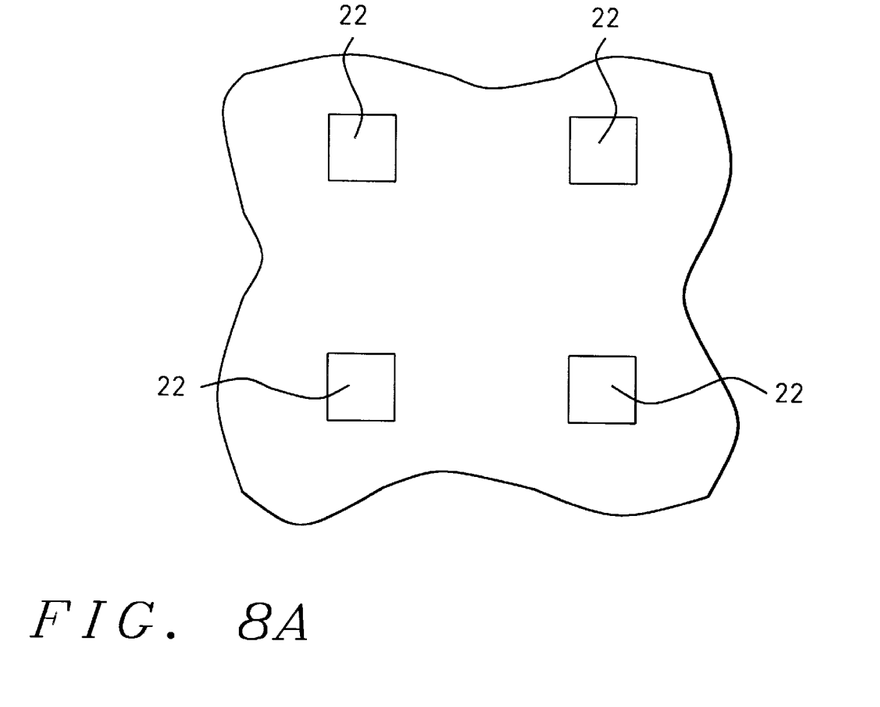
FIG. 8A shows the contact hole pattern corresponding to the first data set.
Figure 8B:
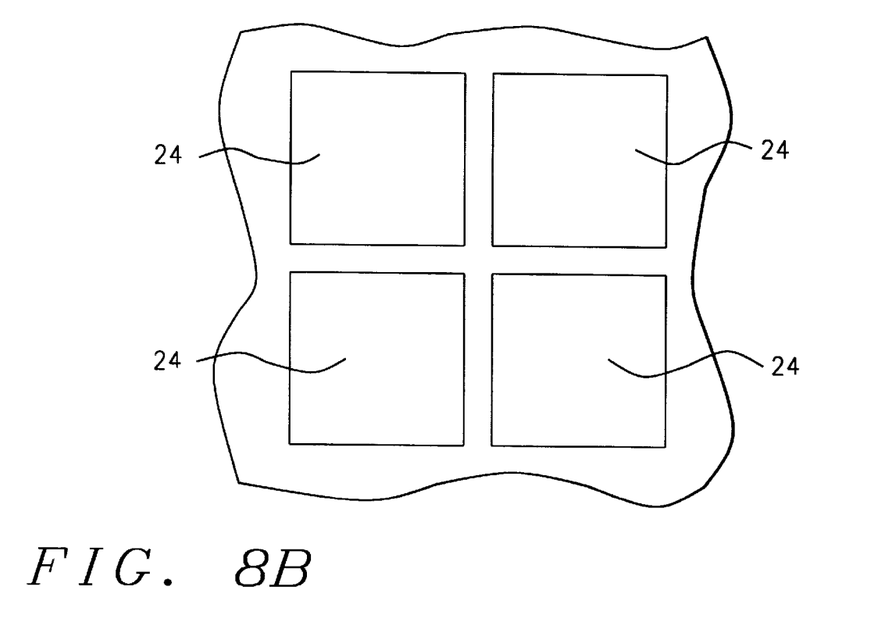
FIG. 8B shows the background pattern corresponding to the second data set.

FIG. 7B shows a detailed flow diagram of the logical operations performed in the computer processor. As shown in FIGS. 7A and 7B, a first data set, P, representing a pattern of contact holes, and a second data set, B, representing an opaque background region are provided loaded into the computer. The first data set, P, and the second data set B, are the data sets used for computer aided design operations. FIG. 8A shows the pattern represented by the first data set showing the contact holes 22. FIG. 8B shows the pattern represented by the second data set showing opaque background regions 24.

Figure 9:
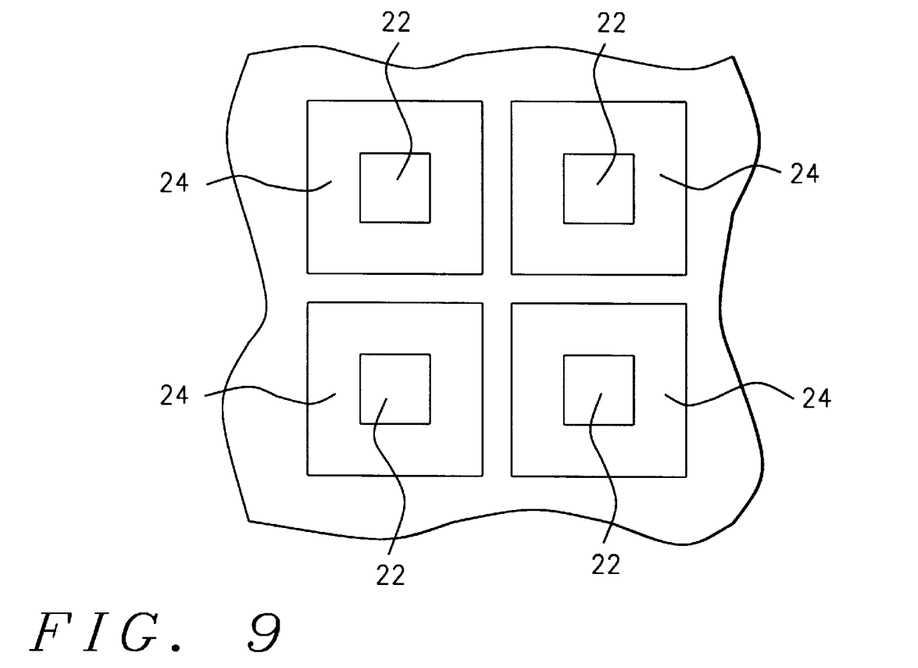
FIG. 9 shows the pattern of contact holes in the background corresponding to the third data set.

As shown in FIG. 7B, the computer then combines the first data set 40 and the second data set 42 into a third data set 44, P+B, using logical addition. As shown in FIG. 9, the third data 44 set represents the pattern of contact holes 22 wherein each contact hole 22 is surrounded by the opaque background 24.

Figure 10:
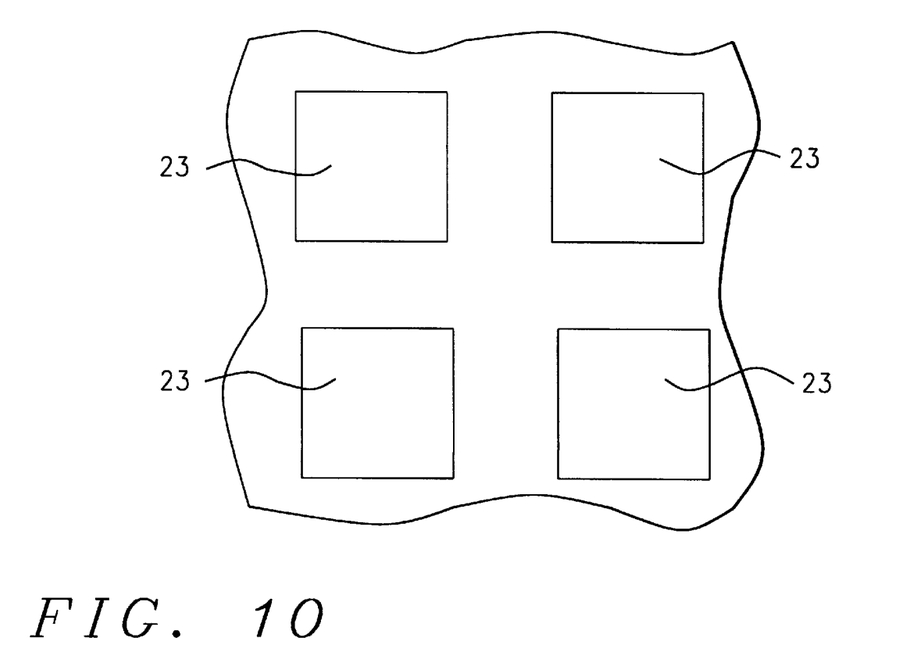
FIG. 10 shows the first correction pattern corresponding to the fourth data set.
Figure 11:
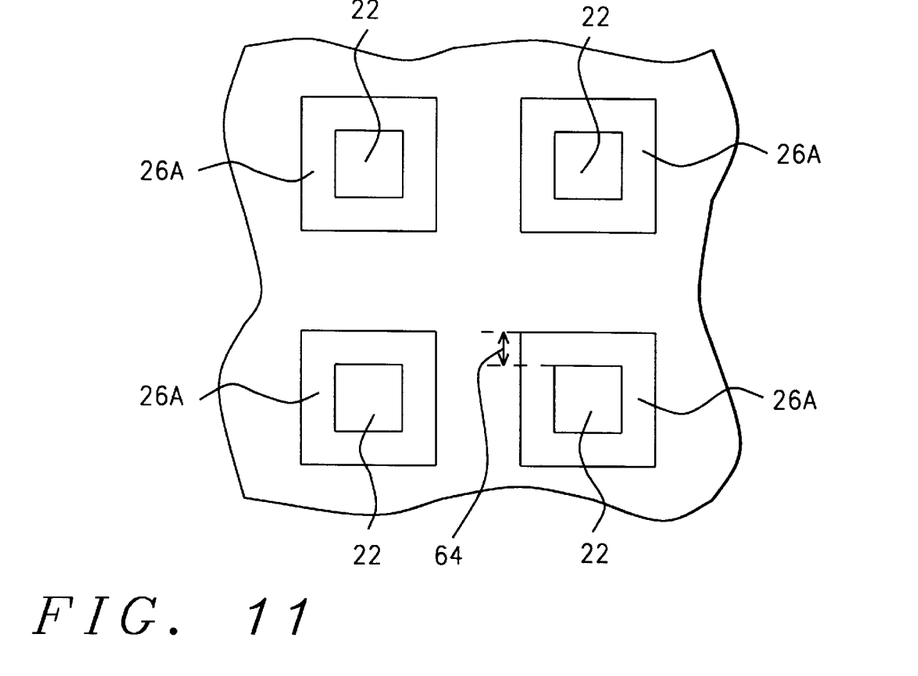
FIG. 11 shows the first correction pattern subtracted from the pattern of contact holes in the background corresponding to the sixth data set.
Figure 12:
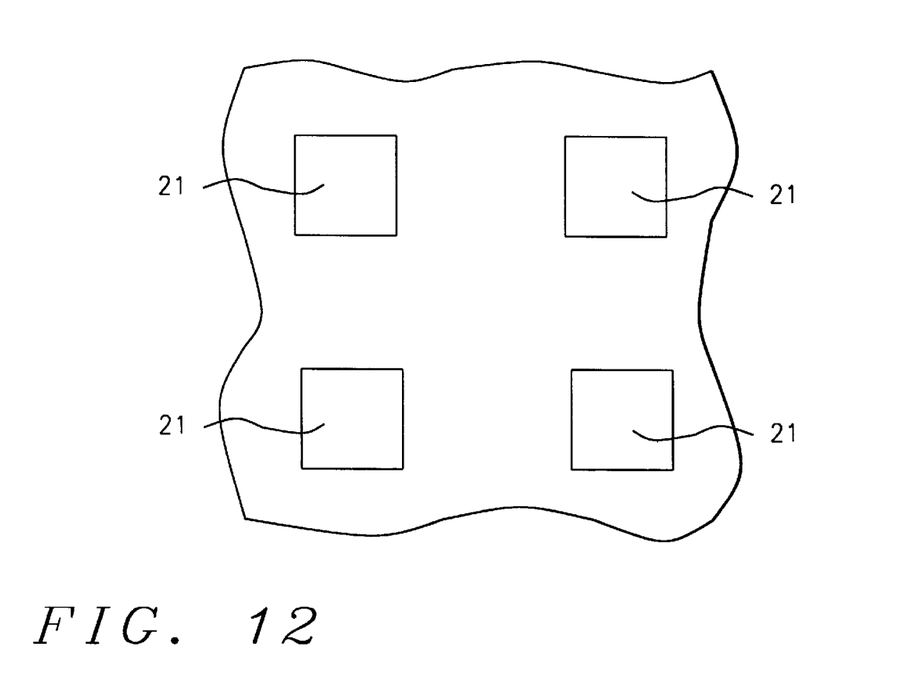
FIG. 12 shows the second correction pattern corresponding to the fifth data set.

As shown in FIGS. 7A and 7B, a fourth data set 46, representing a first correction C1, and a fifth data set 48 representing a second correction C2, are loaded into the computer. As shown in FIG. 10, the fourth data set represents a first sizing square 23. As shown in FIG. 12, the fifth data set represents a second sizing square 21. As shown in FIG. 7B, the computer then combines the third data set 44, P+B, and the fourth data set 46, C1, by logically subtracting the fourth data set from the third data set thereby forming a sixth data set 50, (P+B)−C1. As shown in FIG. 11, the sixth data set represents the contact holes 22 in a background 26A with the size of the background reduced to a first border 26A having a first width 64 surrounding the contact holes 22.

Figure 13:
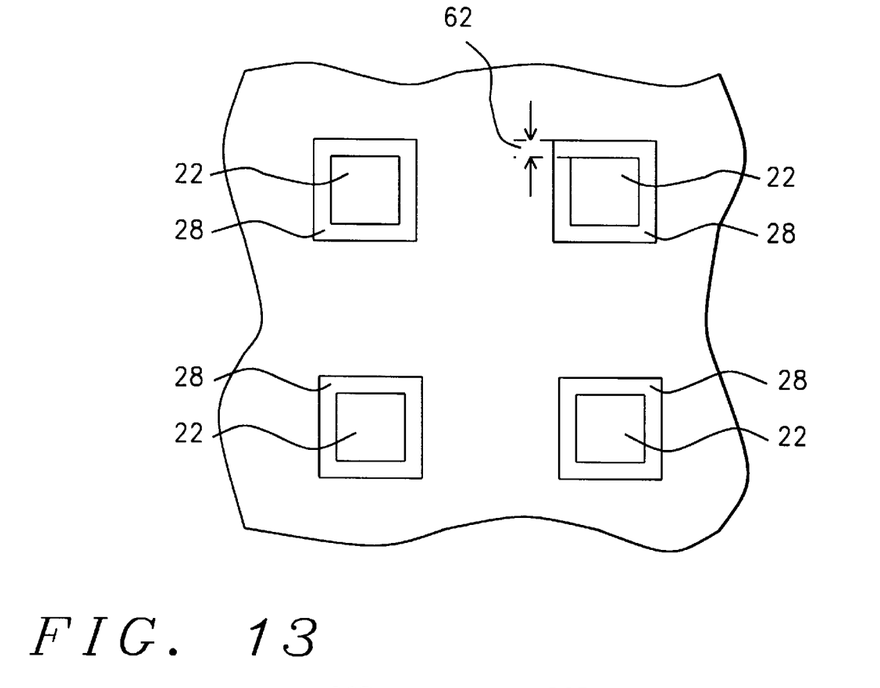
FIG. 13 shows the second correction pattern subtracted from the pattern of contact holes in the background corresponding to the seventh data set.

As shown in FIG. 7B, the computer then combines the third data set 44, P+B, and the fifth data set 48, C2, by logically subtracting the fifth data set from the third data set thereby forming a seventh data set 52, (P+B)−C2. As shown in FIG. 13, the seventh data set represents the contact holes 22 in a background 26A with the size of the background reduced to a second border 28 having a second width 62 surrounding the contact holes 22.

Figure 14:
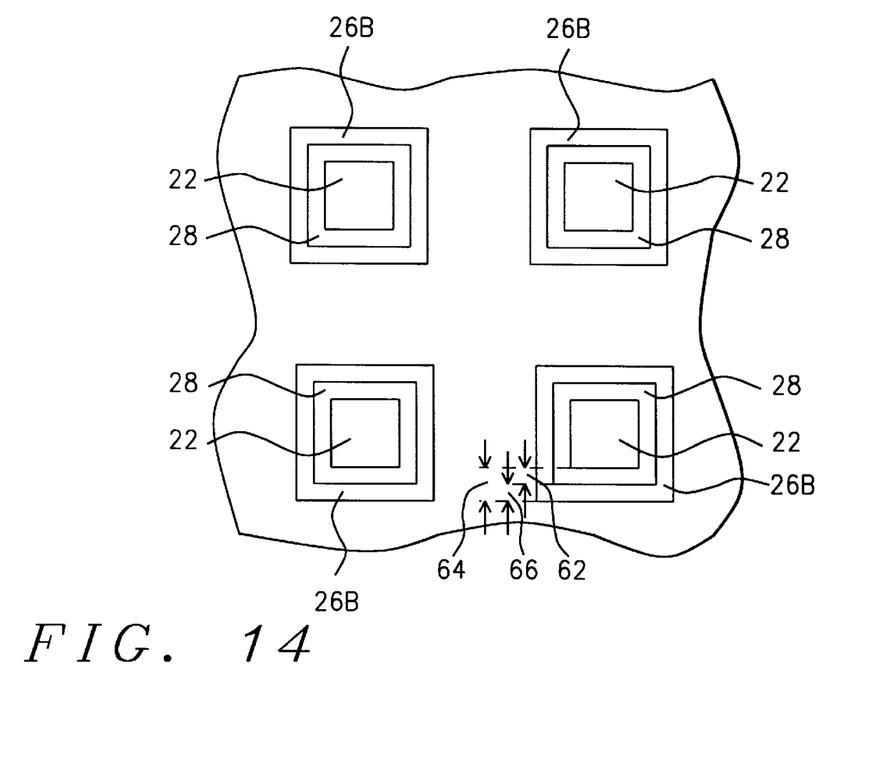
FIG. 14 shows the final pattern corresponding to the final data set.

As shown in FIG. 7B, the computer then combines the sixth data set 50 and the seventh data set 52 by logically subtracting said seventh data set from said sixth data set, thereby forming the final data set 54, ((P+B)−C1)−((P+B)−C2). As shown in FIG. 14, the final data set 54 represents the pattern of contact holes 22 wherein each of the contact holes 22 is surrounded by the second border 28 having the second width 62, and the second border 28 is surrounded by a third border 26B having a third width 66. The third width 66 equal to the second width 62 subtracted from the first width 64. In the final data set the second border 28 represents opaque material surrounding the contact holes 22 and the third border 26B represents attenuating or 100% transmittance phase shifting material surrounding the second border 28. Opaque material will be used to fill the region surrounding the third border 26B of attenuating or 100% transmittance phase shifting material.

As shown in FIG. 7A, the final data set is then used in a mask fabrication step 72 to generate a contact hole mask having an outrigger border pattern of attenuating or 100% transmittance phase shifting material.

While the invention has been particularly shown and described with reference to the preferred embodiments thereof, it will be understood by those skilled in the art that various changes in form and details may be made without departing from the spirit and scope of the invention.

What is claimed is:

1. A method of forming a data set representing a mask pattern, comprising:

providing a first data set representing a first mask pattern;

providing a second data set representing a background mask pattern;

combining said first data set and said second data set using logical addition of said first data set and said second data set, thereby forming a third data set;

providing a fourth data set representing a first mask correction;

providing a fifth data set representing a second mask correction;

combining said fourth data set and said third data set using logical subtraction of said fourth data set from said third data set, thereby forming a sixth data set;

combining said fifth data set and said third data set using logical subtraction of said fifth data set from said third data set, thereby forming a seventh data set; and subtracting said seventh data set from said sixth data set using logical subtraction, thereby forming a final data set wherein said final data set represents an outrigger type phase shifting mask pattern.

2. The method of claim 1 wherein said first mask pattern is a mask pattern for contact holes.

3. The method of claim 1 wherein said third data set represents a mask pattern for contact holes surrounded by a background region.

4. The method of claim 1 wherein said sixth data set represents a mask pattern for contact holes surrounded by a first border wherein said first border has a first width.

5. The method of claim 1 wherein said seventh data set represents a mask pattern for contact holes surrounded by a second border wherein said second border has a second width.

6. The method of claim 1 wherein said final data set represents a mask pattern for contact holes, wherein said contact holes are surrounded by a second border having a second width and said second border is surrounded by a third border having a third width.

7. The method of claim 1 wherein said final data set represents a mask pattern comprising transparent contact holes surrounded by an opaque border having a second width, said opaque border being surrounded by a border of phase shifting material having a third width, and said border of phase shifting material being surrounded by opaque material.

8. The method of claim 7 wherein said phase shifting material is attenuating phase shifting material.

9. The method of claim 7 wherein said phase shifting material has 100% transmittance.

10. The method of claim 1 wherein said logical addition and said logical subtraction are carried out in a computer processor using a computer aided design program.

11. The method of claim 1 wherein said third data set represents said first mask pattern combined with said background mask pattern, said sixth data set represents said first mask correction to said first mask pattern combined with said background mask pattern, and said seventh data set represents said second mask correction to said first mask pattern combined with said second mask pattern.

12. The method of claim 1 wherein said final data set is used to form an outrigger type phase shifting mask.

13. A method of forming a data set representing a mask pattern, comprising:

providing a computer processor;

providing a computer aided design program;

providing a first data set representing a pattern of contact holes;

providing a second data set representing a background;

logically adding said first data set and said second data set using said computer processor and said computer aided design program, thereby forming a third data set wherein said third data set represents a pattern of said contact holes wherein each said contact hole is surrounded by said background;

providing a fourth data set representing a first correction;

providing a fifth data set representing a second correction;

logically subtracting said fourth data set from said third data set using said computer processor and said computer aided design program, thereby forming a sixth data set representing a pattern of said contact holes wherein each of said contact holes is surrounded by a first border having a first width;

logically subtracting said fifth data set from said third data set using said computer processor and said computer aided design program, thereby forming a seventh data set representing a pattern of said contact holes wherein each of said contact holes is surrounded by a second border having a second width; and logically subtracting said seventh data set from said sixth data set using said computer processor and said computer aided design program, thereby forming a final data set representing said pattern of said contact holes wherein each of said contact holes is surrounded by said second border having said second width and said second border is surrounded by a third border having a third width equal to said second width subtracted from said first width.

14. The method of claim 13 wherein said final data set represents a mask pattern comprising transparent contact holes surrounded by an opaque border having said second width, said opaque border being surrounded by a border of phase shifting material having a width equal to said second width subtracted from said first width, and said border of phase shifting material border being surrounded by opaque material.

15. The method of claim 14 wherein said phase shifting material is attenuating phase shifting material.

16. The method of claim 14 wherein said phase shifting material has 100% transmittance.

17. The method of claim 13 wherein said final data set is used with an electron beam to form an outrigger type phase shifting mask.

18. The method of claim 13 wherein said final data set is used to form a mask having transparent contact holes each said contact hole being surrounded by an opaque border, each said opaque border being surrounded by a border of attenuating phase shifting material, and each said border of attenuating phase shifting material being surrounded by opaque material.

19. The method of claim 18 wherein said phase shifting material is attenuating phase shifting material.

20. The method of claim 18 wherein said phase shifting material has 100% transmittance.

* * * * *